(12) United States Patent
Herke

(10) Patent No.: US 7,170,270 B2
(45) Date of Patent: Jan. 30, 2007

(54) CONTROL DEVICE

(75) Inventor: Dirk Herke, Nuertingen (DE)

(73) Assignee: Alcoa Fujikura Gesellschaft mit beschraenkter Haftung, Frickenhausen (DE)

( * ) Notice: Subject to any disclaimer, the term of this patent is extended or adjusted under 35 U.S.C. 154(b) by 410 days.

(21) Appl. No.: 10/809,941

(22) Filed: Mar. 24, 2004

(65) Prior Publication Data
US 2005/0057240 A1 Mar. 17, 2005

Related U.S. Application Data

(63) Continuation of application No. PCT/EP02/10725, filed on Sep. 25, 2002.

(30) Foreign Application Priority Data
Sep. 28, 2001 (DE) .................... 101 49 390

(51) Int. Cl.
G05F 1/56 (2006.01)
(52) U.S. Cl. ...................... 323/282
(58) Field of Classification Search ............. 323/282, 323/284, 285, 288, 290, 293; 327/108, 110, 327/139, 538
See application file for complete search history.

(56) References Cited

U.S. PATENT DOCUMENTS

| 5,420,532 | A | 5/1995 | Teggatz et al. |
| 5,977,743 | A | 11/1999 | Flock |
| 6,181,171 | B1 | 1/2001 | Graf et al. |
| 6,222,356 | B1 | 4/2001 | Taghizadeh-Kaschani |
| 6,621,309 | B2 * | 9/2003 | Roder et al. ............... 327/110 |
| 7,049,832 | B2 * | 5/2006 | Novak et al. ............... 324/713 |
| 7,095,639 | B2 * | 8/2006 | Cho et al. .................... 363/131 |

FOREIGN PATENT DOCUMENTS

| DE | 197 43 346 | 4/1999 |
| DE | 198 14 681 | 10/1999 |
| DE | 199 41 488 | 3/2001 |
| EP | 0 855 799 | 1/1998 |

* cited by examiner

*Primary Examiner*—Adolf Berhane
(74) *Attorney, Agent, or Firm*—Lipsitz & McAllister, LLC

(57) ABSTRACT

The invention relates to a control device for operating a load circuit provided with an inductive load, comprising a control stage producing a pulse-width modulated control signal with measuring disconnection intervals provided in between said control signal, a power stage feeding the load circuit and comprising an electronic switch controlled by the pulse-width modulated control signal and a freewheeling element which is connected in parallel to said load circuit. In order to improve upon said device so that it is possible to determine in a simple manner the amount of current flowing into the load circuit, a current detection unit for determining the amount of current flowing into the load circuit prior to the measuring disconnection interval detects the duration of freewheeling time and calculates the value of said current therefrom.

14 Claims, 4 Drawing Sheets

CONTROL DEVICE

The present disclosure relates to the subject matter disclosed in International application No. PCT/EP02/10725 of Sep. 25, 2002, which is incorporated herein by reference in its entirety and for all purposes.

BACKGROUND OF THE INVENTION

The invention relates to a control device for operating a load circuit having an inductive load, comprising a control stage which generates a pulse-width-modulated control signal with measuring disconnection intervals provided in it, a power stage feeding the load circuit and having an electronic switch controlled by the pulse-width-modulated control signal, and a freewheeling element connected in parallel with the load circuit.

Such control devices are known from the prior art, for example European Patent Application 0 855 799.

In the previously known control devices, the determination of the current flowing into the load circuit takes place either by means of a shunt resistor or a measuring amplifier, which are both expensive to realize. In the case of a shunt resistor there is the additional problem that it adversely affects the efficiency and generates heat.

The invention is therefore based on the object of improving a control device of the generic type in such a way that determination of the current flowing into the load circuit is possible in a simple way.

SUMMARY OF THE INVENTION

This object is achieved according to the invention in the case of a control device of the type described at the beginning in that a current detection unit for determining the current flowing into the load circuit prior to the measuring disconnection interval detects the duration of the freewheeling time in the measuring disconnection interval and calculates the current from this.

The advantage of this solution is to be seen as being that it allows the current flowing into the load circuit to be determined with simple and low-cost means.

With regard to the measurement of the freewheeling time, a wide variety of possibilities are conceivable. For example, it would be conceivable to determine by voltage sampling the time during which there is a freewheeling voltage less than zero in the measuring disconnection interval. However, this would require a high number of samplings.

For this reason, a particularly advantageous exemplary embodiment provides that the current detection unit detects the freewheeling time by means of an integration stage, which integrates a reference value over the freewheeling time. This provides a simple possible way of detecting the freewheeling time by means of a value which is simple to measure.

The integration stage can be operated in a particularly simple way when said integration stage is activated by a switch controlled by the voltage in the load circuit during the time during which the voltage in the load circuit is less than zero.

Such a switch can be configured in the simplest case as a switching transistor, the base of which is controlled by the voltage in the load circuit.

With regard to the formation of the integration stage itself, so far nothing more specific has been stated.

One particularly simple solution provides that the integration stage carries out an integration of a voltage as a reference value over the freewheeling time, since, in the case of the control device according to the invention, voltages can be generated as reference values in a simple way and, furthermore, integrated voltages can be measured in a simple way.

With regard to the circuit-technology formation of the integration stage itself, so far nothing more specific has been stated. One particularly advantageous solution provides that the integration stage comprises an RC element.

With such an RC element, the integration stage can be realized in a particularly simple and low-cost way.

In the case of such an RC element, the integration can be carried out particularly advantageously by the charging of the capacitor of the RC element being controlled by means of an electronic switch which can be controlled by the voltage in the load circuit.

To allow new integrations to be repeatedly started with the integration stage, it is preferably provided that the value stored in the integration stage is erased after completion of the measuring disconnection interval.

This erasure can be realized in a particularly simple way by the value stored in the integration stage being erased by the recurring pulse-width-modulated control signal.

This can be realized in a particularly simple way by the erasure taking place by a connection interval of the pulse-width-modulated control signal.

To be able to evaluate the value for the freewheeling time measured by the integration stage in a simple way, it is preferably provided that the integration stage holds the value determined in the integration until the completion of the measuring disconnection interval.

In the solutions according to the invention described so far, it has just been assumed that the inductive load present in the load circuit generates a freewheeling current.

If, however, the inductive load is an electric motor, this also generates a generator voltage in the measuring disconnection interval, which has an influence on the measured freewheeling time and consequently must also to be taken into account in the calculation of the current flowing into the load circuit.

For this reason, in the case of an exemplary embodiment of the control device according to the invention in which the inductive load used in the load circuit is an electric motor, the current detection unit is formed in such a way that, for determining the motor current in the measuring disconnection interval, it measures the duration of the freewheeling time and the plateau value of the generator voltage after the freewheeling time.

With these parameters, the current detection unit is likewise capable of determining the current into the load circuit before the measuring disconnection interval occurs.

With regard to the determination of the plateau value of the generator voltage, various solutions are conceivable. For example, it would be conceivable to detect the voltage in the measuring disconnection interval after the freewheeling time has elapsed, entailing the problem of eliminating falsifications of the generator voltage which could occur due to all kinds of disturbances.

The plateau value of the generator voltage after the freewheeling time can be determined with sufficient precision when the current detection unit measures the generator voltage in the plateau region by multiple voltage samplings.

The precision of the measurement can be increased by these multiple voltage samplings.

It is particularly advantageous in this respect if the current detection unit carries out an averaging of the values measured in the multiple voltage samplings.

It would be conceivable in principle for the current detection unit always to calculate the current in accordance with the formula linking the freewheeling time, and if appropriate the generator voltage, to the current.

However, this requires considerable computing effort, and consequently considerable computing time, even in the case of processors suitable for this.

For this reason, it is particularly advantageous if, when determining the current by means of the detected measure of the freewheeling time, the current detection unit takes a value from a table with which the current can be determined by multiplication.

This means that the current detection unit, in particular its processor, does not always have to calculate the entire mathematical formula, but instead the computing work takes place when the table is compiled, and consequently the processor of the current detection unit just has to read out the value from the table corresponding to the measure of the freewheeling time and then use this value to carry out another multiplication, for example a multiplication by the constant voltage dropping across the freewheeling element, or if appropriate the sum of this voltage and the generator voltage, in order to obtain a value for the current.

Consequently, the computing effort, and consequently also the computing time, in the determination of the current is reduced considerably, so that the value for the current can be determined in connection with each measuring disconnection interval in a simple way and also with simple processors.

With the solution according to the invention, it is consequently possible even in the case of an electric motor which generates a generator voltage to reduce the computing operations required in the determination of the current during the measuring disconnection interval to an addition and a multiplication, and, in the case of an inductive load which does not generate a generator voltage, to reduce said computing operations to just a multiplication.

Further features and advantages of the invention are the subject of the description which follows and the graphic representation of an exemplary embodiment of a solution according to the invention.

DETAILED DESCRIPTION OF THE INVENTION

Figure 1:
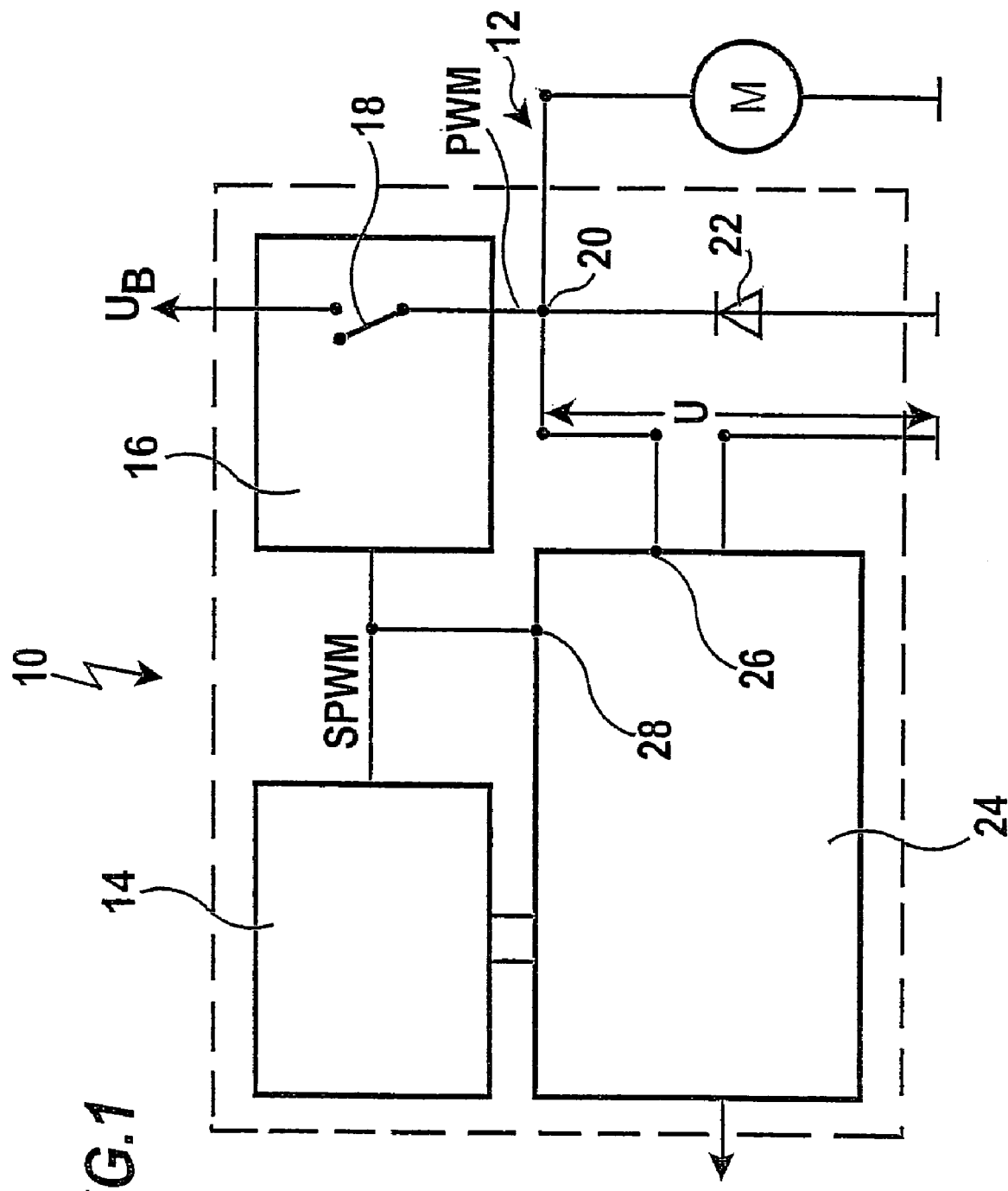
FIG. 1 shows a schematic block diagram of a control device according to the invention.
Figure 2:
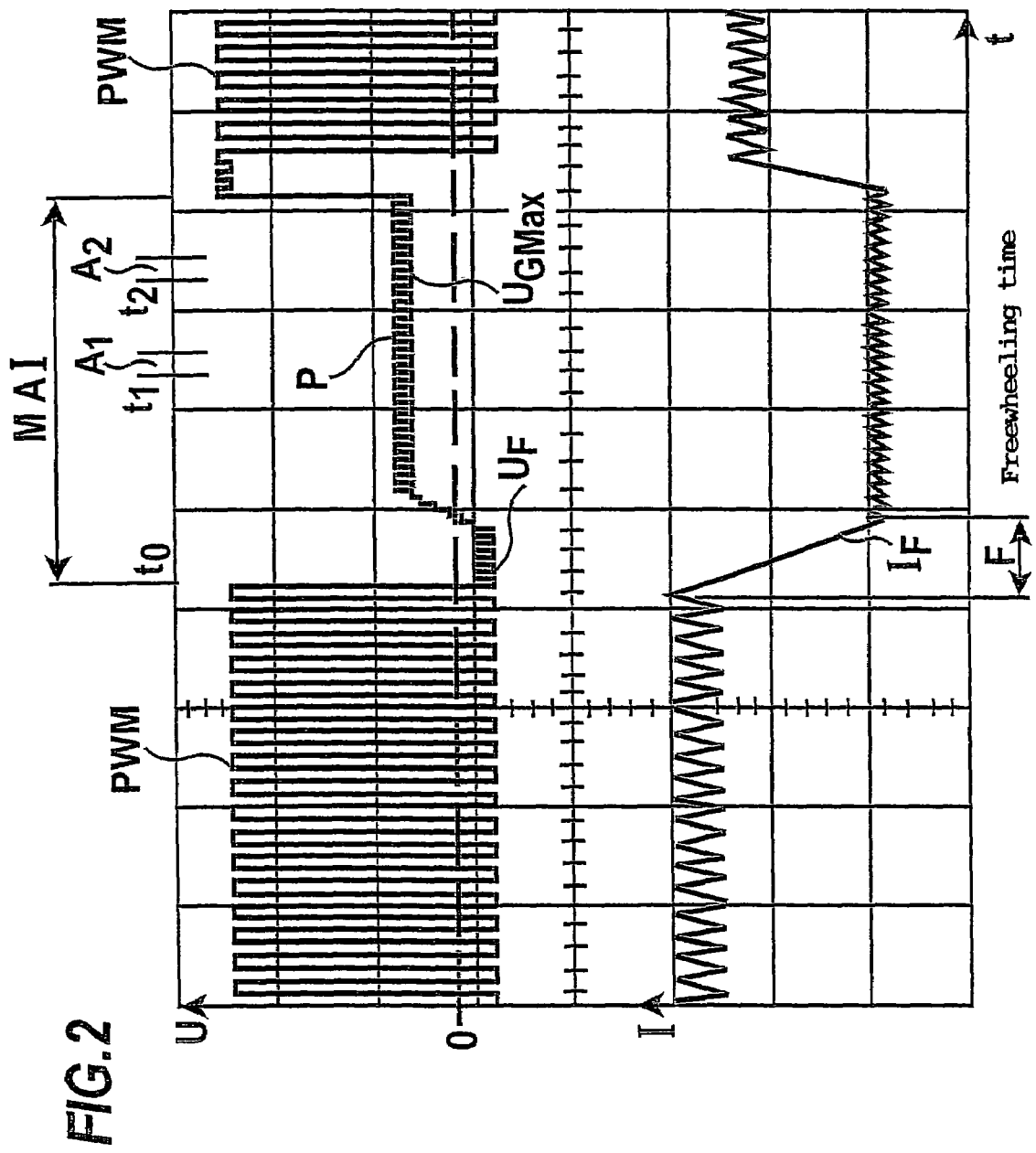
FIG. 2 shows a representation of the behavior of the voltage across the freewheeling element and of the freewheeling current in a measuring disconnection interval.

An exemplary embodiment of a control device according to the invention, designated as a whole by 10 in FIG. 1, operates a load circuit 12 with an inductive load, which in the exemplary embodiment represented is an electric motor M.

According to the invention, however, any other kind of inductive load may also be provided in the load circuit 12, that is to say, for example, also an electromagnet or a heating coil.

For operating the inductive load M, the control device 10 comprises a control stage 14, which generates a pulse-width-modulated control signal SPWM, which can be used to control a power stage 16, which for its part comprises an electronic switch 18, which can be controlled by the pulse-width-modulated control signal SPWM and may be formed, for example, as a field-effect transistor.

With this electronic control switch 18 controlled by the control signal SPWM, a pulse-width-modulated feed voltage PWM that corresponds to the control signal SPWM in terms of its variation over time, for example is inverted, is generated and used for feeding the inductive load M present in the load circuit 12 via a connecting terminal 20 of the latter.

Between the connecting terminal 20 and ground there is furthermore a freewheeling element, for example a freewheeling diode, which is designated as a whole by 22 and takes over the freewheeling current $I_F$ generated by the inductance M when the pulse-width-modulated feed voltage PWM is switched off.

The freewheeling element 22 may, however, also be an electronic switch controlled synchronously with respect to the pulse-width-modulated control signal SPWM.

Furthermore, the control device 10 according to the invention comprises a current detection unit 24, the input 26 of which is connected to the connecting terminal 20, so that the latter is capable of detecting a voltage U present in the load circuit 12.

The current detection unit 24 also has, furthermore, a connection 28, with which it detects the pulse-width-modulated control signal SPWM.

Furthermore, the current detection unit 24 also communicates with the control stage 14 and makes the latter interrupt the pulse-width-modulated control signal SPWM by measuring disconnection intervals, so that, during the feeding of the load circuit 12, the pulse-width-modulated feed voltage PWM is likewise interrupted by such a measuring disconnection interval MAI.

In the event of an interruption of the feeding of the load circuit 12, the inductance present in the load circuit 12 leads to a freewheeling current $I_F$ flowing via the freewheeling element 22 that drops approximately exponentially and flows during a freewheeling time F.

During this freewheeling time F, the freewheeling voltage $U_F$ measured at the terminal 20 of the load circuit 12 is less than zero.

In the case of an inductance in the form of a coil or a magnet or a heater, no voltage occurs any longer in the load circuit 12 within the respective measuring disconnection interval MAI after the freewheeling time F has elapsed.

The current detection unit 24 according to the invention operates in this case in such a way that it detects the freewheeling time F, since this is a measure of the current that has flowed into the load circuit 12 during the time of the switched-on pulse-width-modulated feed voltage PWM.

If, on the other hand, an electric motor M is provided in the load circuit 12 as the inductive load, this electric motor M generates a generator voltage $U_G$ in the measuring disconnection interval MAI after the pulse-width-modulated feed voltage PWM has been switched off. This has to be taken into account in the case of the electric motor M as the inductive load in the load circuit 12 and also has an effect on the freewheeling current $I_F$ and the freewheeling time F. The freewheeling current $I_F$ in this case decays at the opposed generator voltage $U_G$, at the freewheeling element 22 and at the internal resistance of the electric motor M, with $U_F$ corresponding to the diode voltage of the freewheeling element 22 when $I_F$ flows.

The generator voltage $U_G$ is dependent in particular on the construction of the electric motor M, and on its rotational speed.

The generator voltage $U_G$ can be measured within the respective measuring disconnection interval MAI after completion of the freewheeling time F and, starting from the value zero, increases up to a plateau value $U_{GMAX}$; after formation of the plateau value $U_{GMAX}$, the generator voltage $U_G$ should be substantially constant over the entire plateau P over the time axis t if no disturbances falsify this plateau value $U_{GMAX}$.

It is possible in principle to measure the freewheeling time F by testing how long the voltage U across the freewheeling element 22 corresponds to the diode voltage of, for example, −0.7 V.

In this case, the load current $I_{load}$ can be calculated as follows:

$$I_{load} = \frac{\frac{(U_{GMAX} + U_D)}{R_L}\left(1 - e^{-\frac{R_L}{L_L}F}\right)}{e^{-\frac{R_L}{L_L}F}}$$

where
$U_{GMAX}$ is the generator voltage to be measured
F is the freewheeling time to be measured
$U_D$ is the voltage dropping across the freewheeling element 22
$R_L$ is the ohmic resistance in the load circuit 12
$L_L$ is the inductance of the load circuit 12

Figure 3:
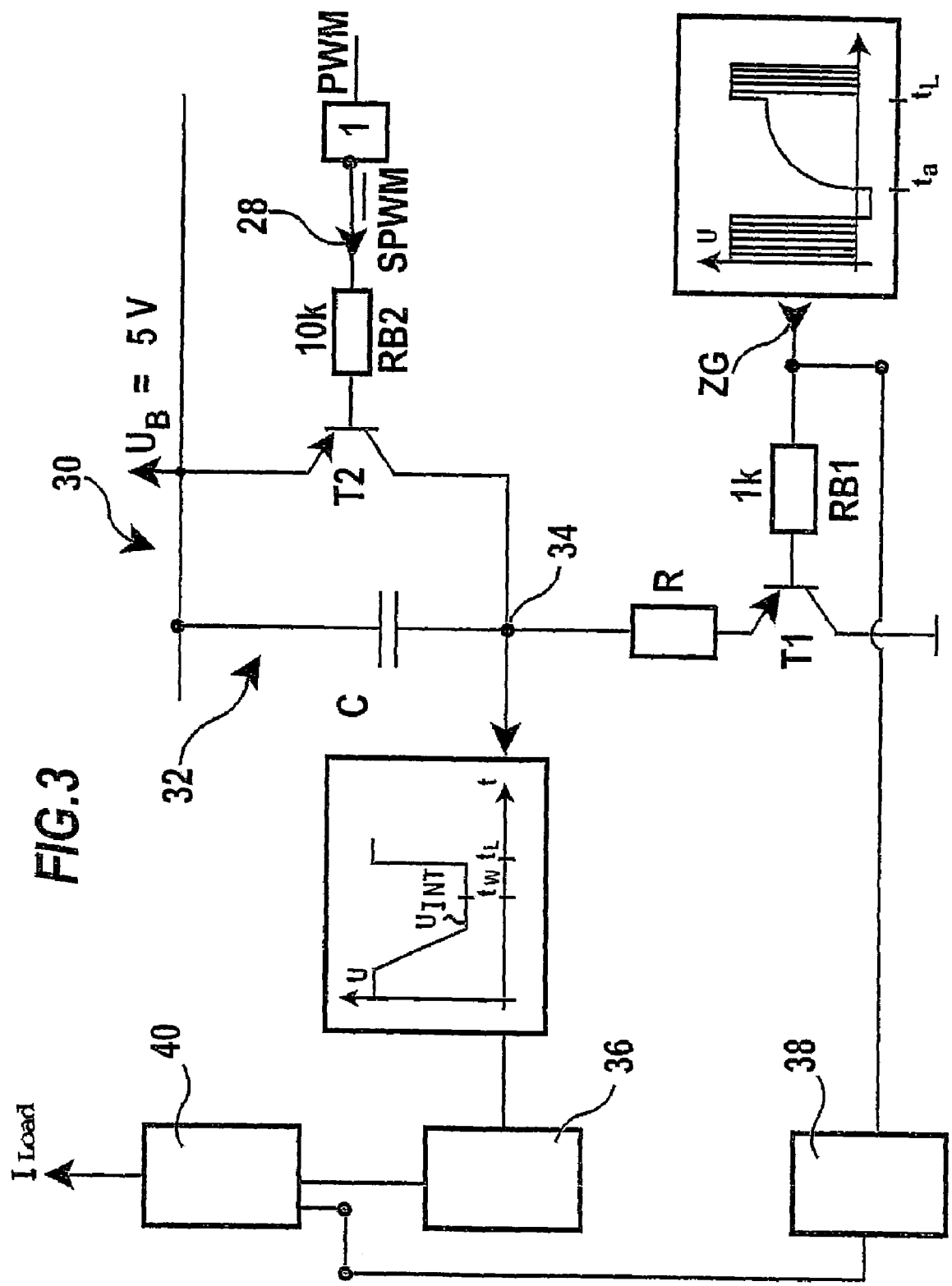
FIG. 3 shows a schematic representation of an integration stage with evaluation in the case of the current detection unit according to the invention.

Since the duration of the freewheeling time F is problematical to measure, preferably used according to the invention in the current detection unit 24 for measuring the freewheeling time F is an integration stage 30, which is represented in FIG. 3 and comprises an RC element 32, which lies between a battery voltage UB and ground and the capacitor C of which is connected on the one hand to the stabilized battery voltage UB and on the other hand via a center tap 34 to the resistor R, which in its turn can be connected to ground via a switching transistor T1.

For charging the capacitor C of the RC element 32, the base of the transistor T1 is connected to the connection 26, and consequently to the connecting terminal 20, a base resistor RB being provided between the connection 26 and the base of the switching transistor T1.

Figure 4:
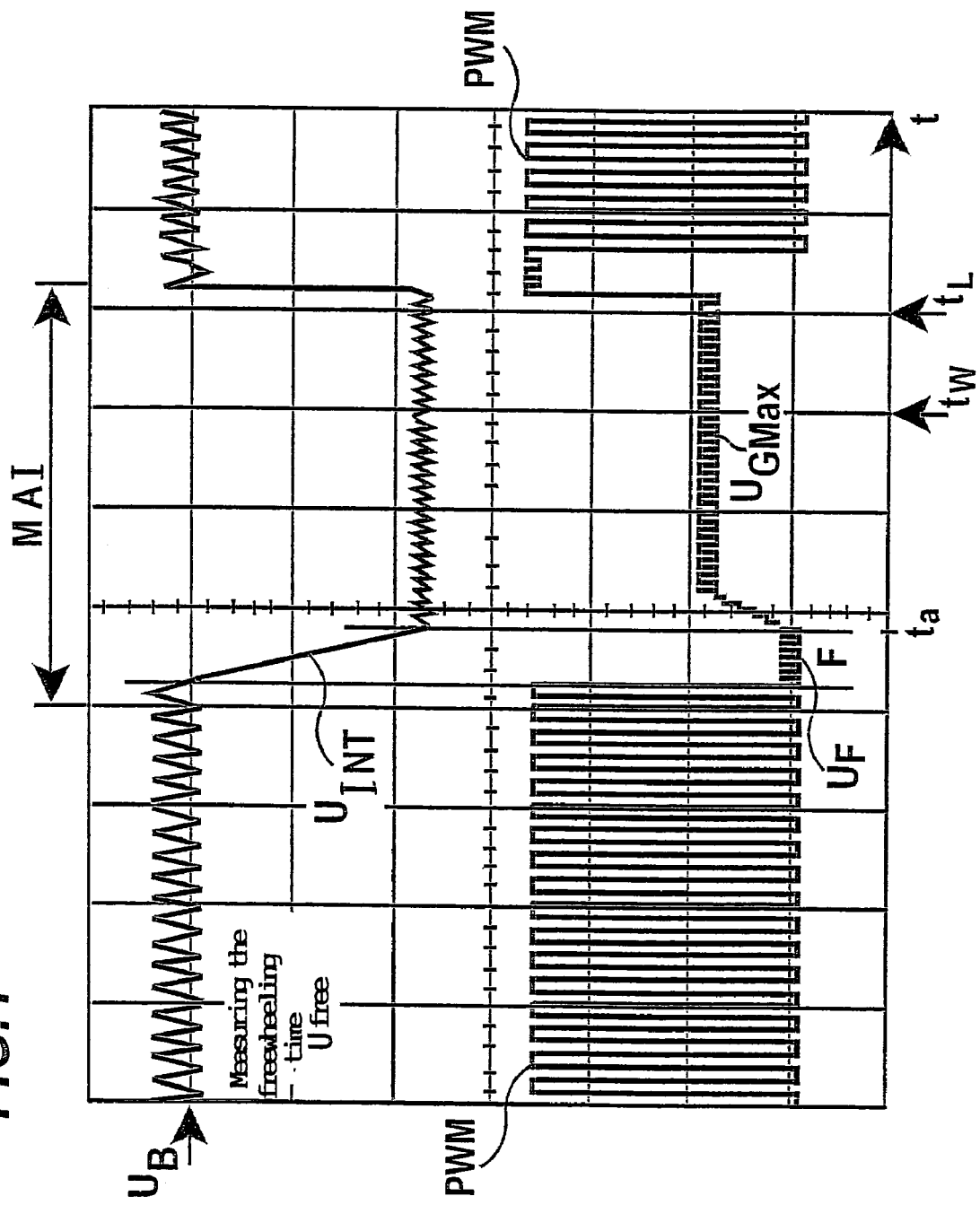
FIG. 4 shows a representation of a voltage $U_{INT}$ over the variation of the voltage across the freewheeling element.

If the switching transistor T1 is turned on, charging of the capacitor C takes place via the resistor R, which is connected to ground when the switching transistor T1 is turned on, in which connection a voltage $U_{INT}$ at the center tap 34 that represents the result of an integration corresponds in the first instance to the battery voltage $U_B$, with the capacitor C discharged, and then drops as the charging of the capacitor C increases, as represented schematically in FIG. 3 and as a measurement in FIG. 4.

This voltage $U_{INT}$ at the center tap 34 is converted, for example by an A/D converter 36, into a digital value at a point in time $t_W$, the point in time $t_W$ being set within the measuring disconnection interval MAI such that the detection of $U_{INT}$ by conversion into a digital value takes place with certainty after completion of the maximum possible freewheeling time.

In order to erase the voltage value $U_{INT}$ stored in the capacitor C, between the center tap 34 and the battery voltage $U_B$ there is a switching transistor T2, the base of which is controlled by the pulse-width-modulated control signal SPWM via a base resistor RB2, in this case the pulse-width-modulated control signal SPWM being inverted with respect to the pulse-width-modulated feed voltage PWM (FIG. 3).

This pulse-width-modulated control signal SPWM is present at the connection 28 of the current detection unit 24.

The switching transistor T2 is respectively turned on when there is a switching-on edge of the pulse-width-modulated feed voltage PWM, and consequently discharges the capacitor C at the point in time $t_L$ (FIG. 4).

The integration stage 30 likewise also runs when there is the normal pulse-width-modulated feed voltage PWM and, during the disconnection intervals of the pulse-width-modulated feed voltage PWM, integrates a value which, however, is erased again by the switching transistor T2 at the connection intervals of the pulse-width-modulated feed voltage PWM.

At a measuring disconnection interval MAI, a turning on of the switching transistor T1 takes place during the time during which the freewheeling voltage $U_F$ is present, and consequently the voltage U across the freewheeling element 22 is negative, and consequently a charging of the capacitor C, and consequently a lowering of the voltage $U_{INT}$ present at the center tap 34, takes place during the freewheeling time F up to the point in time at which the freewheeling voltage $U_F$ becomes equal to zero. The lowered value which the voltage $U_{INT}$ reaches by the end of the freewheeling time F at the center tap 34 represents the measure of the duration of the freewheeling time F.

This value $U_{INT}$ is held by the capacitor C until the next switching-on edge of the pulse-width-modulated feed voltage PWM occurs at the point in time $t_L$.

For measuring the maximum generator voltage $U_{GMAX}$, an A/D converter 38 is also connected at the same time to the connection 26, and the two A/D converters 36 and 38 of the current detection unit 24 are coupled to a processor 40 of the current detection unit 24, which performs the evaluation and determines the load current.

The measurement of the maximum generator voltage $U_{GMAX}$ takes place with the A/D converter 38 at two points in time $t_1$ and $t_2$ in the range of the measuring disconnection interval in which the plateau P of the generator voltage $U_G$ is present, by voltage samplings A1 and A2, the mean value of the voltages $U_{GMAX}$ measured at the points in time $t_1$ and $t_2$ preferably being formed in order to eliminate disturbances.

However, it is also conceivable to perform voltage samplings with the A/D converter 38 at further points in time and then to determine a mean generator voltage $U_{GMAX}$ by means of multiple voltage samplings.

The processor 40 is then capable of determining the mean values of the voltages $U_{GMAX}$ converted by the A/D converter 38 and use these and the voltage $U_{INT}$ converted by the A/D converter 36, which represents a measure of the freewheeling time, to calculate the load current $I_{LOAD}$.

The processor 40 in this case preferably determines the load current $I_{Load}$ according to the formula $$I_{load} = (U_{GMAX} + U_D)\frac{\frac{1}{R_L}\left(1 - e^{-\frac{R_L}{L_L}(-R)C \cdot \ln\frac{U_{INT}}{U_B}}\right)}{e^{-\frac{R_L}{L_L}(-R)C \cdot \ln\frac{U_{INT}}{U_B}}} \cdot k$$

where
$I_{load}$ is the load current to be calculated
$U_{GMAX}$ is the generator voltage to be measured $U_{int}$ is the voltage value that is stored in the capacitor C and is to be measured $U_D$ is the voltage dropping across the freewheeling element 22, which is constant $R_L$ is the ohmic resistance in the load circuit 12, which is constant $L_L$ is the inductance of the load circuit 12, which is constant, R is the ohmic resistance of the RC element 32, which is constant C is the capacitance of the RC element 32, which is constant $U_B$ is the stabilized battery voltage present at the RC element, which is constant U is a motor constant, which is constant.

Since only the generator voltage $U_{GMAX}$ and the voltage value $U_{INT}$ are variable parameters, which also change when there is a change in $I_{load}$, there is the possibility of simplifying the calculation of $I_{load}$ and storing the values W of the entire expression $$\frac{\frac{1}{R_L}\left(1 - e^{-\frac{R_L}{L_L}(-R)C\cdot\ln\frac{U_{INT}}{U_B}}\right)}{e^{-\frac{R_L}{L_L}(-R)C\cdot\ln\frac{U_{INT}}{U_B}}} \cdot k = W$$

as a table of values dependent on $U_{INT}$:

| $U_{INT1}$ | $U_{INT2}$ | $U_{INT3}$ | ... | $U_{INTn}$ |
|---|---|---|---|---|
| $W_1$ | $W_2$ | $W_3$ | – | $W_n$ | so that, after each determination of $U_{INT}$, the corresponding value W can be read out from the table and, as a consequence, there is no longer any need for complicated and time-consuming computing operations for the calculation of $I_{load}$ in the respective measuring disconnection interval.

For example, the voltage samplings at the points in time $t_1$ and $t_2$ are first carried out and therefrom $U_{GMAX}$ is calculated by the processor 40 by averaging. Subsequently, at the point in time $t_W$, $U_{INT}$ is also determined—as a measure of the freewheeling time F—and $I_{load}$ is then calculated by the processor 40 in accordance with the formula $I_{load} = (U_{GMAX} + U_D)W$.

If, instead of the motor M, there is only an inductance, for example in the form of a magnet or a coil, in the load circuit 12, no generator voltage $U_G$ occurs, and the generator voltage $U_{GMAX}$ is to be set to zero in the formula.

The processor 40 is consequently capable after each measuring disconnection interval MAI of calculating the current $I_{load}$ that has flowed into the load circuit 12 with the previous pulse-width-modulated feed voltage PWM.

The invention claimed is:

1. Control device for operating a load circuit having an inductive load, comprising a control stage which generates a pulse-width-modulated control signal with measuring disconnection intervals provided in this control signal, a power stage feeding the load circuit and having an electronic switch controlled by the pulse-width-modulated control signal, and a freewheeling element connected in parallel with the load circuit, a current detection unit which for determining the current flowing into the load circuit prior to the measuring disconnection interval detects the duration of the freewheeling time in the measuring disconnection interval and calculates the current from this.

2. Control device according to claim 1, wherein the current detection unit detects the freewheeling time by means of an integration stage, which integrates a reference value over the freewheeling time.

3. Control device according to claim 2, wherein the integration stage is activated by an electronic switch controlled by the voltage in the load circuit during the time during which the voltage in the load circuit is less than zero.

4. Control device according to claim 2, wherein the integration stage carries out an integration of a voltage as a reference value over the freewheeling time.

5. Control device according to claim 4, wherein the integration stage comprises an RC element.

6. Control device according to claim 5, wherein the charging of the capacitor of the RC element is controlled by means of an electronic switch which can be controlled by the voltage in the load circuit.

7. Control device according to claim 2, wherein the value stored in the integration stage is erased after completion of the measuring disconnection interval.

8. Control device according to claim 7, wherein the value stored in the integration stage is erased by the recurring pulse-width-modulated control signal.

9. Control device according to claim 8, wherein the erasure takes place by a connection interval of the pulse-width-modulated control signal.

10. Control device according to claim 2, wherein the integration stage holds the value determined in the integration until the completion of the measuring disconnection interval.

11. Control device according to claim 1, wherein, in the case of an electric motor as the inductive load in the load circuit, for determining the current flowing into the load circuit in the measuring disconnection interval, the current detection unit measures the duration of the freewheeling time and the plateau value of the generator voltage after the freewheeling time.

12. Control device according to claim 11, wherein the current detection unit measures the generator voltage in the plateau region by multiple voltage samplings.

13. Control device according to claim 12, wherein the current detection unit carries out an averaging of the voltages measured in the multiple voltage samplings.

14. Control device according to claim 1, wherein, when determining the current by means of the detected measure of the freewheeling time, the current detection unit determines a value from a table with which the current can be determined by multiplication.

* * * * *